United States Patent [19]

Bonyhard et al.

[11] 4,012,726
[45] Mar. 15, 1977

[54] MAGNETIC BUBBLE REPLICATOR

[75] Inventors: Peter Istvan Bonyhard, Edison; James Lanson Smith, Bedminster, both of N.J.

[73] Assignee: Bell Telephone Laboratories, Incorporated, Murray Hill, N.J.

[22] Filed: Dec. 23, 1975

[21] Appl. No.: 643,679

[52] U.S. Cl. ............... 340/174 TF; 340/174 SR
[51] Int. Cl.² .............. G11C 11/14; G11C 19/08
[58] Field of Search ........... 340/174 TF, 174 CR, 340/174 PA, 174 CS

[56] References Cited

UNITED STATES PATENTS

| | | | |
|---|---|---|---|
| 3,924,249 | 12/1975 | George | 340/174 TF |
| 3,925,769 | 12/1975 | George | 340/174 TF |
| 3,947,830 | 3/1976 | George | 340/174 TF |
| 3,971,038 | 7/1976 | Myer | 340/174 TF |

OTHER PUBLICATIONS

"Device Design & System Organization for a Decoder Accessed Mag. Bubble Memory" by Bonyhard et al., A.I.P. Conference Proceedings, No. 18, Part I, Magnetism & Magnetic Materials, pp. 100–103.

*Primary Examiner*—Vincent P. Canney
*Attorney, Agent, or Firm*—Herbert M. Shapiro

[57] ABSTRACT

An improved magnetic bubble replicator is characterized by relatively high bias and phase margins. Both the orientation of a replicate conductor with respect to a permalloy replicator element and the shape of the replicator element are shown to be important in determining those margins. Such replicators are typically employed to produce an image of a bubble pattern in a channel adjacent a plurality of closed loop paths in which the bubble pattern moves.

11 Claims, 8 Drawing Figures

MAGNETIC BUBBLE REPLICATOR

BACKGROUND OF THE INVENTION

1. Field of the Invention

This invention relates to magnetic bubble memories.

2. Description of the Prior Art

Magnetic bubble memories are well known in the art. The most familiar type of bubble memory is one in which a pattern of magnetic elements is formed adjacent the surface of a film in which the bubbles are moved. The elements are designed such that a repetitive pattern of magnetic poles move along channels defined by the elements in response to a magnetic drive field reorienting in the plane of bubble movement. The elements, generally, are composed of magnetically soft permalloy and are in T and bar shapes in the most familiar circuits. Most recently, asymmetric half-disc shaped elements are being used.

Magnetic bubbles are of circular or disc-shape when observed under a microscope through an analyzer in the presence of polarized light as is well known. The diameter of the disc is determined by a bias field antiparallel to the magnetization of the bubble. Typically, an epitaxially grown garnet film defines the plane of bubble movement and the magnetization of the film is normal to the plane. Thus, the bias field is oriented normal to the plane of bubble movement in a direction antiparallel to the magnetization of the bubble. The reorienting (typically rotating) magnetic in-plane field can be understood to generate pole patterns in the permalloy elements. These pole patterns, in turn, modify the bias field causing localized magnetic field gradients in the film resulting in bubble movement. Due to the fact that bubble movement is caused by a magnetic field rather than by an arrangement of electrical conductors and due to the fact that the permalloy elements are operative to move those bubbles to a detector for accessing information represented by the bubble pattern, this form of bubble memory is commonly called a "field access" bubble memory.

A field access bubble memory is commonly organized in a "major-minor" configuration. The term "major-minor" describes an organization in which the pattern of permalloy elements defines a plurality of closed loop paths, termed "minor" loops, about which bubble patterns move and an accessing path called the "major" path. The plurality of minor loops is operative as a permanent store. Information in the form of a bubble pattern is moved in parallel from the permanent store to the accessing path at reference positions defined typically by a "turn" element in each minor loop. To this end, an interchannel, bubble movement-controlling, permalloy pattern is formed between the turn element of each minor loop and an associated stage of the accessing channel. An electrical conductor couples the "interchannel" permalloy pattern and/or turn elements causing the information, represented by the bubble pattern, to be moved between channels when the conductor is pulsed.

The information can be moved between channels in a variety of modes. In one of these modes, bubble transfer occurs. In this mode, the interchannel permalloy patterns and turn elements define bubble "transfers" operative to move information from the minor loops to the major channel leaving vacancies at the turn elements. In this form of bubble memory, the major channel is in the form of a recirculating loop also and the number of stages in the major loop is related to the number in each minor loop such that as the in-plane field continues to rotate, the transferred information and the vacancies from which the information originated move about the various loops and arrive at the interchannel pattern simultaneously. A second pulse later applied to the transfer conductor is operative to restore the transferred information to the originating positions.

An alternative mode of operation for bubble memories results when a plurality of bubble replicators are employed. The replicators are operative to produce an image of the bubble pattern, for example, at the turn elements in the minor loops for movement to the major channel. Again, an electrical conductor couples the interchannel patterns and/or turn elements electrically in series for controlling the replication operation. This form of bubble memory has the virtue that image information need not be returned to the originating vacancies, thus leading to faster accessing times.

A bubble replicator operates by stretching a bubble into an elongated form and by generating a cutting field in the middle of the so-stretched bubble causing separation into two. The constraints to this operation arise primarily from the bias field and the in-plane field. The constraint due to the bias field arises from the fact that every bubble memory exhibits stable operation over a range of bias field values from a low value at which bubble strip-out occurs to a high value at which bubble collapse occurs. Although operation occurs over a very generous range, bubble elongation is reduced at the high bias field end of the range. The constraint due to the in-plane field arises from the fact that bubble elongation and cutting occurs over only a portion of a cycle of the in-plane field. The higher the frequency of the field, the greater the constraint on the replicator. Naturally, if the replicator were able to operate over an increased portion of an in-plane field cycle, those constraints due to the in-plane field would be reduced.

An increase in the bulk of the permalloy of the turn element also would be a benefit. A properly designed pattern would produce increased pole strength which would operate to elongate the bubble in spite of high bias field values. But, increased pole strength is achieved at the expense of elongated features in the turn element geometry and these features always seem to produce unwanted poles in unwanted positions and to occupy increasing amounts of precious film surface area.

BRIEF DESCRIPTION OF THE INVENTION

The present invention is based on the recognition that increased bulk of a turn element can be achieved by combining into that element additional channel-defining elements normally operative for moving bubbles in a closed loop. It is further based on the recognition that the electrical conductor employed to control replication is operable over a large portion (or phase) of the in-plane field cycle if it couples the turn element to the side or at an angle to the long axis of each minor loop rather than in alignment with that axis as is customary in the prior art. The resulting sideways, or off-axis, orientation of the conductor and the corresponding asymmetry in the turn element of a minor loop herein are considered important features herein. The off-axis alignment of the conductor in the illustrative arrangement necessitates the generation of the image in positions incompatible with adjacent major path element orientations so that direct entry of the image into the major path is not easily implemented. Thus, additional path elements are provided in the interchannel pattern allowing the replicated image to be entered into the major path properly. Accordingly, an additional feature of the illustrative embodiment of this invention is the presence of these additional interchannel elements.

In a preferred embodiment of this invention, a minor loop was defined by adjacent asymmetric permalloy discs on fourteen micron centers. The loop included a turn element composed of two facing asymmetric discs separated at the ends facing the loop and filled in with permalloy between the other ends of the elements. The two facing discs operate as normal propagation or channel-defining elements. The filled-in area was enlarged at the element end further in the direction of bubble movement - that is, downstream from the long axis of the loop. A hairpin (replicate) conductor was positioned to correspond to the enlarged area and, illustratively, was oriented at 90° with respect to the long axis. Replication was achieved over a bias range of forty oersteds with phase margins of a minimum of about 35° to 40°. Particularly attractive high end margins were achieved by incorporating into the turn element the next preceding channel-defining element for providing a long flux path when cutting occurs without requiring the presence of an unwanted repelling pole at that time.

DETAILED DESCRIPTION

Figure 1:
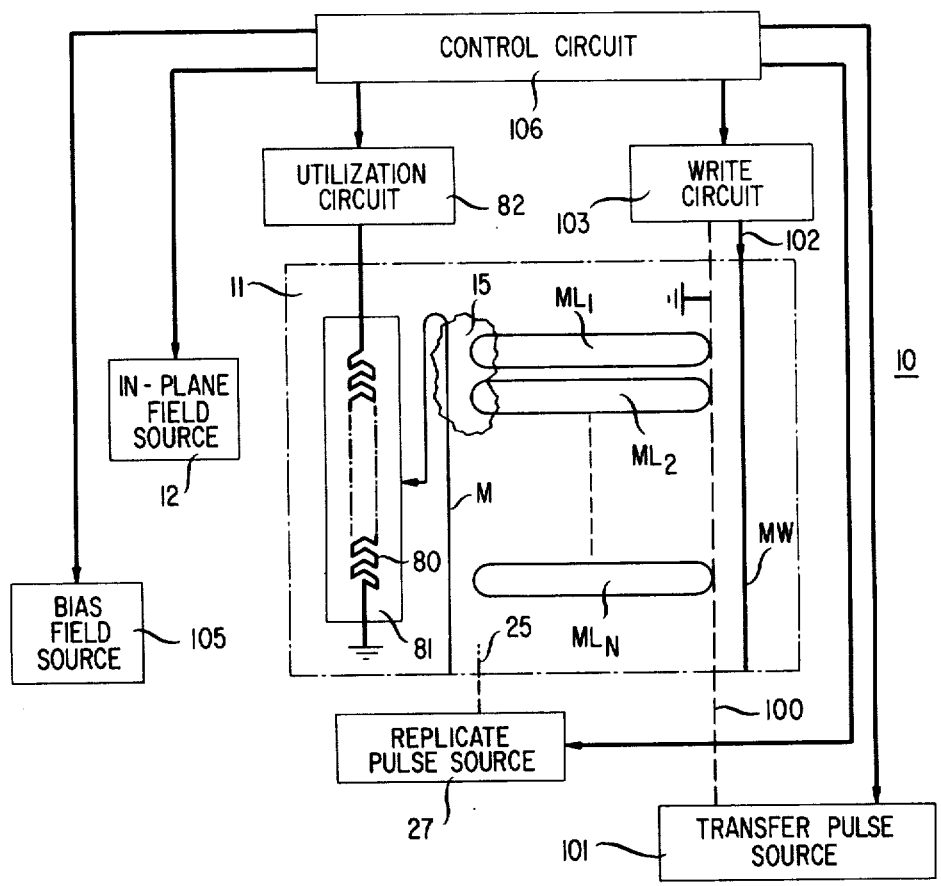
FIG. 1 is a schematic representation of a magnetic bubble memory in accordance with this invention.

FIG. 1 shows a magnetic bubble memory 10 comprising a layer 11 of material in which magnetic bubbles can be moved. Bubble patterns are moved in layer 11 along minor loops defined by a pattern of permalloy elements and designated $ML_1$, $ML_2$, — $ML_N$ in the figure. Movement occurs in response to a magnetic field rotating counter-clockwise in the plane of layer 11. The field is supplied by a well-known in-plane field source such as a pair of tuned circuits driven in quadrature or a triangular wave source and is represented by block 12 in the figure.

Figure 2:
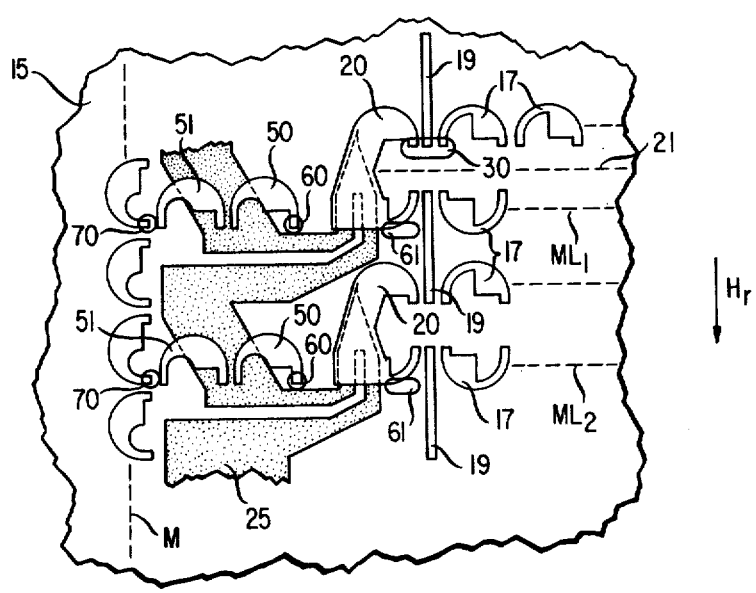
FIGS. 2 through 6 are top views of portions of the memory of FIG. 1 showing the permalloy and conductor pattern thereof as well as bubble positions during operation of a replicator.

FIG. 1 also shows a major path M. A bubble pattern is replicated into the major path at predesignated positions between the minor loops and path M. Such positions occur at "replicators" herein and are located in a representative area designated 15 in FIG. 1. FIG. 2 shows the conductor and permalloy pattern for area 15. It is to be understood that the permalloy pattern is illustratively in a plane further from layer 11 than the plane of conductor pattern, and that the various planes are separated by electrically insulating layers typically of silicon oxide.

Figure 3:
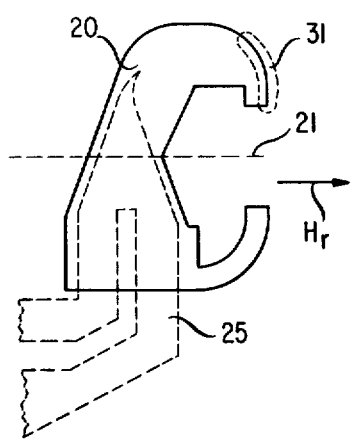

A replicator can be seen to occupy an area between the left end of a minor loop and the major path as viewed in FIG. 2. The minor loop is defined by a sequence of asymmetric half-discs 17 and includes bars 19 and a turn element 20. Of prime importance is the turn element. A representative turn element is shown in FIG. 3 and can be seen to have an asymmetric shape conveniently described with respect to broken line 21 which represents the imaginary long axis of the minor loop. The turn element can be seen to form a pair of jaws to the right as viewed. These jaws align with neighboring permalloy elements of the loop. To the left of the element below line 21, the turn element occupies a relatively large area.

A single replicate conductor 25 overlies layer 11 at the positions of all the turn elements in a manner to form a hairpin geometry at the enlarged lower end of each turn element. Due to the (angularly) offset position of the hairpin with respect to the axis 21 in each instance, the replicator is called a "sideways" replicator. The conductor is connected between a replicate pulse source 27 as shown in FIG. 1 and ground.

The sideways replicator is operative in a manner analogous to prior art replicators in that a bubble is elongated along a permalloy element during propagation. Elongation occurs across a (hairpin) conductor to which a cut pulse is applied later to separate the elongated bubble into two. The sideways replicator will be shown herein to provide relatively wide operating margins because of the incorporation of neighboring propagation elements into the turn element itself and the sideways correspondence between the turn element and the replicate conductor.

Consider first the movement of a bubble counterclockwise in loop $ML_1$, positioned at the lower end of element 19 and extending from the next preceding element 17 to the turn element as indicated by broken closed loop 30 in FIG. 2. This position is occupied by a bubble (or no bubble) when the in-plane field ($H_r$) is oriented downward as indicated by arrow $H_r$ in FIG. 2. The bubble next moves to the position 31 indicated in FIG. 3 when the field reorients to the direction indicated by arrow $H_r$ in FIG. 3.

Figure 4:
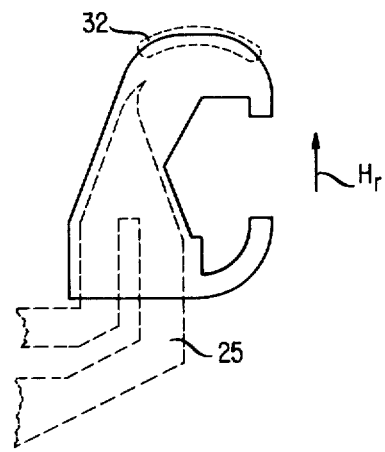
Figure 5:
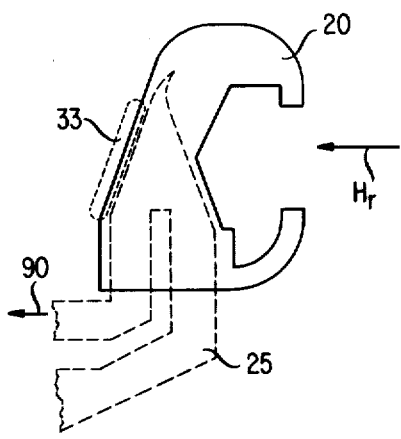

When the field reorients upward and then to the left as indicated by arrows $H_r$ in FIGS. 4 and 5, the bubble advances first to position 32, then to position 33, as indicated in those figures.

Figure 6:
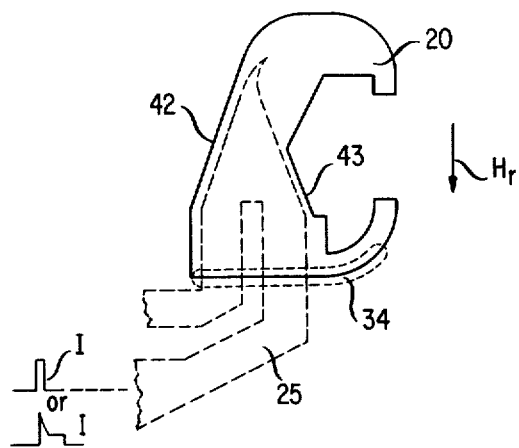
Figure 7:
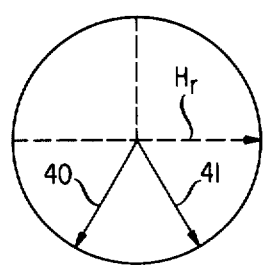
FIGS. 7 and 8 are margin diagrams of that operation.

As the in-plane field starts to reorient downwards as indicated by arrow $H_r$ in FIG. 6, the bubble strips along the enlarged bottom of element 20, as viewed in the figure, and then contracts downwards from the position shown in FIG. 5. For the orientation of field $H_r$ shown in FIG. 6, the bubble occupies position 34. The bubble can be seen to occupy a position stripped across hairpin conductor 25 for in-plane field orientations varying widely about the orientation shown in FIG. 6. FIG. 7 shows arrows 40 and 41 indicating the limits for the phase of the in-plane field over which the bubble is sufficiently elongated to permit cutting into two when a current pulse I of FIG. 6 is applied to conductor 25 by source 27.

Element 20, in the illustrative embodiment, is designed to have sloping edges 42 and 43 (see FIG. 6) parallel to arrows 40 and 41 and thereby defines a long flux path in element 20 for an in-plane field oriented between the two orientations 40 and 41. This permits increased pole strength for achieving elongation even for high bias field conditions.

A test circuit of the type shown in FIG. 2 was constructed using calcium germanium yttrium samarium lutetium garnet characterized by a three micron diameter bubble. The permalloy pattern had a 16 micron period and a two micron gap. Propagation margins were taken with a 35 oersted in-plane field operating at 100 kilohertz. Propagation occurred over a bias range of 129 oersteds to 159 oersteds for a single bubble and from 128 to 158 oersteds for a full loop. For a nominal bias field value of 145 oersteds, replication occurred over a 35 to 40° phase range of the in-plane field cycle. Cut pulses (see FIG. 6) of from 100 milliampere to 220 milliampere and ranging from one to three microseconds in duration were employed.

Figure 8:
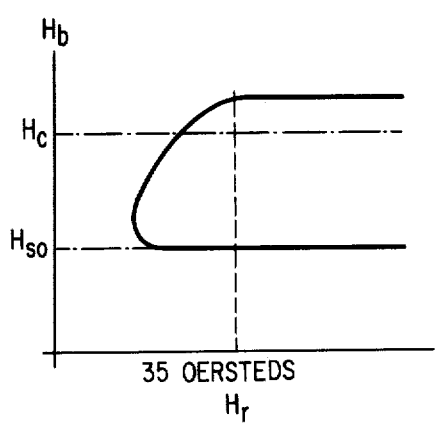

FIG. 8 shows the propagation margin plot of bias field $H_b$ and in-plane field $H_r$ for the representative test circuit. With a bubble layer exhibiting a 25 oersted range between strip-out ($H_{so}$) and collapse ($H_c$) values, propagation occurred over a 30 oersted range. It is to be noted that operation occurred at values higher than collapse. Not only were propagation and replicate margins attractively wide, but also operation occurred with widely ranging cut pulses. The pulse form (1) with the prespike as shown in FIG. 6 had prespike values ranging between 100 and 220 milliamperes with the remainder of the pulse form having an amplitude of from 10 to 30 milliamperes and a duration of from one to three microseconds. The prespike is of a duration to just cut the strip in half and the remainder of the pulse is operative to transfer the trailing half of the strip from element 20 to element 50.

As can be seen in FIGS. 1 and 2, a cut pulse is operative to generate an image of the bubble pattern occupying a position 34, as shown in FIG. 6, for each minor loop. The image moves to major path M in response to next consecutive reorientations of the in-plane field. But, since the image is generated when the in-plane field is directed generally downward as viewed in FIG. 6 (that is within the limits indicated by arrows 40 and 41 in FIG. 7), the asymmetric discs defining path M, in the illustrative embodiment, are not oriented for accepting bubbles at that time. Consequently, interchannel elements 50 and 51 are employed at each minor loop to define a track for moving the image to the major path.

Movement of the image bubble to the right bottom leg of an element 50 occurs when the cut pulse is applied because the image bubble moves across the top of the conductor (25) as viewed in FIG. 2. In this connection, it is helpful to understand that the pulse in conductor 25 is poled to provide a field antiparallel to the magnetization of a bubble between the legs of the hairpin. Thus, the field at the top edge of the conductor is in a direction to cause bubble strip-out. When the cut pulse terminates, a bubble (or no bubble) thus is moved to a position 60 on element 50, the original bubble being moved to a position 61 on an element 20 in FIG. 2.

When the in-plane next reorients through two cycles, movement of the image to the major path is complete, the bubbles occupying positions 70 shown in FIG. 2 for later movement upward along path M. Two interchannel elements, 50 and 51, are employed herein only to permit sufficient area for the conductor 25 to be defined. Actually, a single element or many elements may be used.

The image bubble pattern in path M is moved to a magneto-resistive detector 80 defined in a stage of a familiar expansion detector 81 as shown in FIG. 1. The pattern is moved sequentially through the detector to generate signals which are applied to utilization circuit 82 before being annihilated in, for example, a guardrail structure (not shown).

A particularly advantageous attribute of the sideways replicator may be appreciated from an inspection of FIG. 2 when it is remembered that replication occurs when the in-plane field is directed as shown in that figure. Consider the pole configurations in elements 20 at this time. It is clear that the bottom of each element 20 is poled to attract bubbles whereas the top of each element is poled to repel bubbles. The resulting positive-negative pole pattern is present when the cut pulse is applied and is operative to inhibit unwanted bubble strip-out (from minor loop to minor loop) along conductor 25 at this time. The result is particularly attractive operation under low bias fields values at which bubble strip-out limits operation of prior art structures.

We have now seen that bubble patterns stored in minor loops can be imaged and read out employing sideways replicators (turn elements 20 and conductor 25) and interchannel elements. It now remains, for completeness, to demonstrate how bubble patterns are written into minor loops and eliminated from the minor loops when it is desired to store new information. A selected bubble pattern may be eliminated from the minor loops by applying a pulse to conductor 25 when the in-plane field is oriented as shown in FIG. 5 rather than when the field is oriented for replication as shown in FIG. 6. That is to say, a pulse on conductor 25, applied before the leading edge of an elongated bubble (33 of FIG. 5) reaches conductor 25, is operative to strip the bubble in the direction of arrow 90 of FIG. 5. As the in-plane field reorients to the direction shown in FIG. 6 in this instance, the bubble is transferred to position 60 of FIG. 2 leaving a vacancy in the corresponding minor loop. The pulse on conductor 25 (the "transfer" pulse in this instance) is then terminated.

Further rotations of the in-plane field in the illustrative embodiment result in movement of the vacancies to the opposite end of the minor loops where a write operation occurs. At that opposite end, the minor loops come into close proximity with a write major path MW in FIG. 1. At the positions of close proximity between the loops and path MW, transfer functions are defined by permalloy elements and an electrical conductor. Alternative permalloy elements for a transfer function are well known in the art and not described herein. But, the transfer conductor for such a function is represented by broken line 100 in FIG. 1 and is shown connected between a transfer pulse source 101 and ground. The transfer arrangement is operative to move a bubble pattern into the vacancies in the minor loop when source 101 applies a pulse to conductor 100. The bubble pattern so transferred is entered into the major path MW in response to a pulse-no pulse signal applied to a bubble generator, indicated by arrow 102, during each cycle of the in-plane field. The pulse signal is applied by write circuit 103.

The bubbles are maintained at a nominal diameter during the various operations herein by a bias field provided by a source indicated by block 105 in FIG. 1.

Sources 12, 27, 101, 105 and circuits 82 and 103 are activated and synchronized under the control of a control circuit represented by block 106 in FIG. 1. The various sources and circuits may be any such elements capable of operating in accordance with this invention.

The invention is disclosed in terms of a pattern of permalloy elements which include bar-shaped elements 19 adjacent the turn elements. These bar-shaped elements are employed to increase pole strength when the in-plane field is aligned to move a bubble to or from the turn element and are helpful primarily at the high end of the bias field range of operation. In the absence of the bars, operation is still highly attractive and any "high end" loss is limited to a few oersteds which may be compensated for by a change in the geometry of the turn element to increase the flux path length in the turn element for an orientation of the in-plane field when a bubble is moved to the turn element and to reduce the path length for an orientation when a bubble is moved from the turn element.

What has been described herein is considered merely illustrative of the principles of the invention. Accordingly, various modification thereof can be devised by those skilled in the art in accordance with this invention as encompassed by the following claims.

What is claimed is:

1. A magnetic bubble memory comprising a layer of material in which magnetic bubbles can be moved, a pattern of elements for defining in said layer first and second channels along which bubbles move in response to a magnetic field reorienting in the plane of said layer, said first path including a turn element and having a long axis, an electrical conductor coupling said turn element at an angle with respect to said axis, said element having a geometry to provide an elongated flux path when said field is aligned at said angle.

2. A memory in accordance with claim 1 wherein said elements comprise permalloy and said turn element has a geometry to encompass the next preceding element of said first path for defining said elongated flux path.

3. A memory in accordance with claim 2 wherein said elements of said first path define a closed loop.

4. A memory in accordance with claim 3 including a plurality of first paths, each having a turn element coupled by said conductor.

5. A memory in accordance with claim 4 wherein said conductor couples said turn elements electrically in series and at an angle of about 90° with respect to said axis at each of said loops.

6. A memory in accordance with claim 5 wherein said conductors are of a hairpin geometry at each of said turn elements, said memory also including permalloy interchannel elements between each of said turn elements and an associated stage of said second path.

7. A magnetic bubble memory including a layer of material in which magnetic bubbles representative of information can be moved, and a periodic pattern of path-defining elements for forming first and second paths about which bubbles move in response to a cyclical drive field, said first channel including a turn element of a geometry to encompass the period of a next preceding channel-defining element therein for defining an elongated flux path along a first axis, and electrical conductor means including an electrical conductor coupled to said turn element and oriented with respect thereto in alignment with said first axis.

8. A memory in accordance with claim 7 wherein said path-defining elements comprise permalloy material, said electrical conductor being operative to divide a bubble into two at said turn element when pulsed.

9. A memory in accordance with claim 8 including a plurality of first paths wherein said electrical conductor couples each of said turn elements electrically in series and is operative to generate an image of the bubble pattern in said first paths at said turn elements when said conductor is pulsed.

10. A memory in accordance with claim 9 wherein said first paths are closed loops.

11. A memory in accordance with claim 10 also including means for selectively changing the patterns of bubbles in said loops, and means for detecting said image.

* * * * *